(12) United States Patent
Feng et al.

(10) Patent No.: US 7,834,373 B2
(45) Date of Patent: Nov. 16, 2010

(54) SEMICONDUCTOR DEVICE HAVING CURRENT SPREADING LAYER

(75) Inventors: Jian Feng, Hong Kong (HK); Hung-Shen Chu, Hsinchu (TW); Shengmei Zheng, Hong Kong (HK)

(73) Assignee: Hong Kong Applied Science and Technology Research Institute Company Limited, Shatin, New Territories (HK)

( * ) Notice: Subject to any disclaimer, the term of this patent is extended or adjusted under 35 U.S.C. 154(b) by 667 days.

(21) Appl. No.: 11/638,638

(22) Filed: Dec. 12, 2006

(65) Prior Publication Data

US 2008/0135867 A1    Jun. 12, 2008

(51) Int. Cl.
*H01L 33/36* (2010.01)
(52) U.S. Cl. .............................. 257/99; 257/80; 257/81
(58) Field of Classification Search .................... 257/80, 257/81, 99
See application file for complete search history.

(56) References Cited

U.S. PATENT DOCUMENTS

| | | | |
|---|---|---|---|
| 5,008,718 A | 4/1991 | Fletcher et al. | |
| 5,481,122 A | 1/1996 | Jou et al. | |
| 6,486,499 B1 | 11/2002 | Krames et al. | |
| 6,512,248 B1 | 1/2003 | Takeuchi et al. | |
| 6,650,018 B1 | 11/2003 | Zhao et al. | |
| 6,677,615 B2 * | 1/2004 | Takeuchi et al. | ............. 257/81 |
| 6,797,987 B2 | 9/2004 | Chen | |
| 6,958,494 B2 | 10/2005 | Lin et al. | |
| 7,075,120 B2 | 7/2006 | Sasaki et al. | |
| 2005/0110029 A1 * | 5/2005 | Aoyagi et al. | ................. 257/94 |
| 2006/0038186 A1 | 2/2006 | Sasaki et al. | |
| 2006/0163603 A1 | 7/2006 | Takeuchi et al. | |

FOREIGN PATENT DOCUMENTS

| | | | |
|---|---|---|---|
| JP | 2001168381 A2 | 6/2001 | |
| JP | 2005191326 A2 | 7/2005 | |

* cited by examiner

*Primary Examiner*—Howard Weiss
*Assistant Examiner*—Tifney L Skyles
(74) *Attorney, Agent, or Firm*—Wells St. John, P.S.

(57) ABSTRACT

A semiconductor device has a current spreading layer between a semiconductor material and an electrode for connecting the semiconductor material to an electrical power supply. The current spreading layer has two or more sublayers of a first conductive material with patterned regions of a second conductive material distributed between the sublayers for spreading an electrical current passing between the electrode and the semiconductor material. The second material has an ohmic resistance lower than the first material.

8 Claims, 4 Drawing Sheets

SEMICONDUCTOR DEVICE HAVING CURRENT SPREADING LAYER

BACKGROUND to THE INVENTION

1. Field of the Invention

The present invention relates to current spreading in semiconductor devices, and more particularly to light emitting diodes (LED) having a current spreading layer to improve current distribution in a light emitting region of the device.

2. Background Information

FIGS. 1 and 2 is a schematically illustration of a known LEDs 100, 110. The LED comprises a layer of p-type semiconductor material 102, a layer of n-type semiconductor material 103 and an active, or light generating, layer 104 at the p-n junction. The LED is formed on a substantially transparent substrate of a material 105 such as Sapphire. Terminals 106, 107 are connected to the p-type and n-type semiconductor materials 102, 103 for supplying power to the LED. A small part of the p-type material 102 and p-n junction 104 are removed by etching to expose the n-type material 103 for connection of the n-terminal 107.

When a voltage is applied to terminals 106 and 107 a current flows through the semiconductor materials 102 and 103. Electrons and holes flow into the p-n junction and when an electron meets a hole it falls into a lower energy level which releases a photon, the fundamental element of light. For maximum efficient and light output current must flow generally uniformly through the whole active region. Gallium nitride (GaN) is a popular LED semiconductor material because of its wide bandgap. However, is the difficulty to achieve good ohmic contact between a P-type GaN semiconductor material, for example layer 102, and the electrode terminal 106. If good ohmic contact is not achieved then current tends to crowd and flow only through the area of the active region directly below the terminal. Mush of the light output from this area of the active region is blocked by the terminal itself.

Various techniques are available to solve this current crowding problem. U.S. Pat. No. 5,008,718 describes a popular technique which involves inserting a highly conductive transparent contact layer 108 between the p-type semiconductor layer 102 and terminal 106. The transparent window layer is typically a semiconductor material having a lower electrical resistivity and greater bandgap than the p-type semiconductor layer 102. The drawbacks of this technique are that the transparent window layer is extremely thick, which increases manufacturing cost, and has poor transparency which blocks or absorbs some light.

Another popular layer if to insert a thin film of Indium Tin Oxide (ITO) layer 109 between the terminal 106 and p-type semiconductor layer 102. ITO has a higher transparency than a transparent semiconductor layer, but has poorer current spreading ability due to its single layer structure.

These and other conventional solutions to the current spreading problem often trade of efficiencies between good ohmic contact and transparency o the contact layer. Accordingly, is an object of the present invention to provide a LED device which overcomes at least ameliorates some of the deficiencies exhibited by prior LEDs.

SUMMARY OF THE INVENTION

In view of the forgoing, there is disclosed herein a semiconductor device having a layer of semiconductor material, an electrode for connecting the semiconductor material to an electrical power supply and a current spreading layer located between the electrode and the semiconductor material, wherein the current spreading layer comprises two or more sub-layers of a first material and regions of a second material distributed between the sub-layers for spreading an electrical current passing between the electrode and the semiconductor material.

Preferably, the first material has a first ohmic resistance and the second material has a second ohmic resistance that is lower than the first ohmic resistance.

Preferably, the regions of the second material comprise an array of thin flat metallic pads.

Preferably, the regions of second material have a first distribution density between sub-layers closest to the electrode and have a second distribution density between sub-layers closest to the semiconductor material, and wherein the second distribution density is greater than the first distribution density.

Preferably, the current spreading layer comprises at least a first sub-layer of the first lo material adjoining the electrode, a second sub-layer of the first material adjoining the semiconductor material and regions of the second material distributed between the first and second sub-layers in a pattern adapted to spreading an electrical current passing between the electrode and the semiconductor material.

Preferably, the current spreading layer comprises a third sub-layer of the first material located between the first and second sub-layers and wherein the regions of the second material are distributed between the first and third sub-layers and between the third and second sub-layers in patterns adapted to spreading an electrical current passing between the electrode and the semiconductor material.

Preferably, the regions of second material have a first distribution density between the first and third sub-layers and have a second distribution density between the third and second sub-layers, and wherein the second distribution density is greater than the first distribution density.

Preferably, the second material of the same type as the electrode.

Preferably, the semiconductor material contains a p-type dopant.

The is also disclosed in a semiconductor device having two or more regions of doped semiconductor material, a pair of electrodes for connecting the semiconductor device to a power supply and a current spreading layer located between one of the electrodes and the semiconductor device, wherein the current spreading layer comprises two or more sub-layers of thin transparent film having a first ohmic resistance and flat thin metallic pads having a second ohmic resistance distributed between the sub-layers, and wherein the second ohmic resistance is lower than the first ohmic resistance.

The is also disclosed in a light emitting diode device comprising:
  a multi-layer structure of adjoining semiconductor materials having a light emitting region aligned along a junction between the adjoining semiconductor materials,
  a pair of electrodes electrically connected to respective ones of the semiconductor materials for supplying current to the light emitting region, and
  a current spreading layer located between one of the electrodes and the respective semiconductor material, wherein the current spreading layer comprises two or more sub-layers of light transmissive conducting film interspersed with regions of low ohmic material distributed between the sub-layers for spreading an electrical current passing between the electrode and the semiconductor material.

Further disclosure and aspects of the invention are provided in and will become apparent from the following description.

BRIEF DESCRIPTION OF THE DRAWINGS

An exemplary form of the present invention will now be described by way of example only and with reference to the accompanying drawings, in which.

DESCRIPTION OF THE EXEMPLARY EMBODIMENTS

Figure 1:
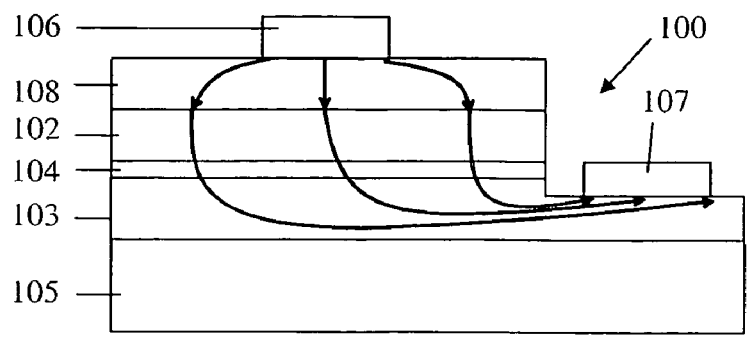
FIGS. 1 and 2 schematically illustrate a prior art LEDs.
Figure 2:
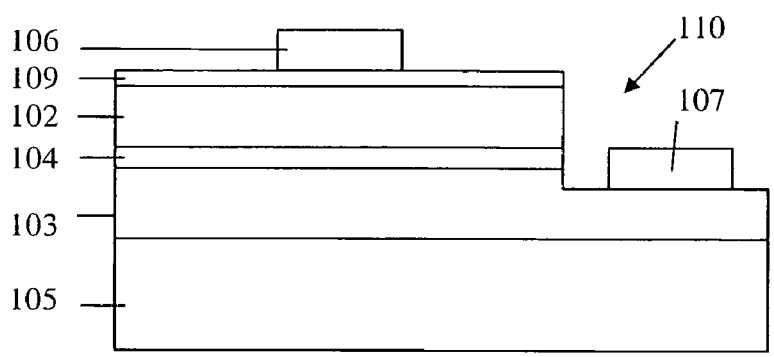

In the various drawings similar elements are identified by the same reference numerals. It will be appreciated by the skilled-addressee that the various layers of the drawings are illustrative only and not to scale.

Figure 3:
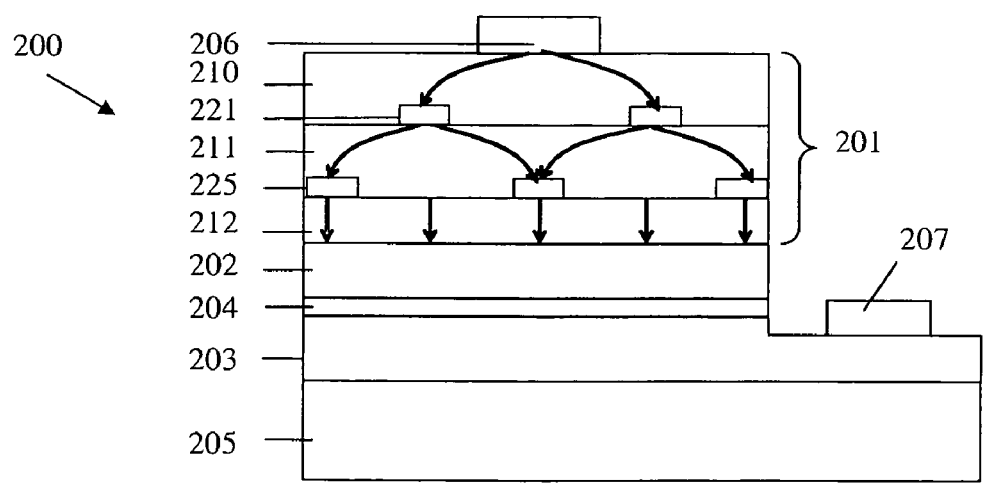
FIG. 3 schematically illustrates an LED according to the invention.

FIGS. 3 schematically illustrate an exemplary embodiment of a light emitting diode (LED) device 200 according to the present invention in its basic form. The LED 200 comprises a layer of p-type semiconductor material 202, a layer of n-type semiconductor material 203 and an active, or light generating, layer 204 at the p-n junction. The LED 200 is formed on a substantially transparent substrate of a material 205 such as Sapphire. A transparent current spreading layer 201 is overlaid on the p-type semiconductor material 202. Terminals 206, 207 are connected to the current spreading layer 201 and n-type semiconductor materials 203 for supplying power to the LED. A small part of the p-type material 202 and p-n junction 204 are removed by etching to expose the n-type material 203 for connection of the n-terminal 207.

Figure 4:
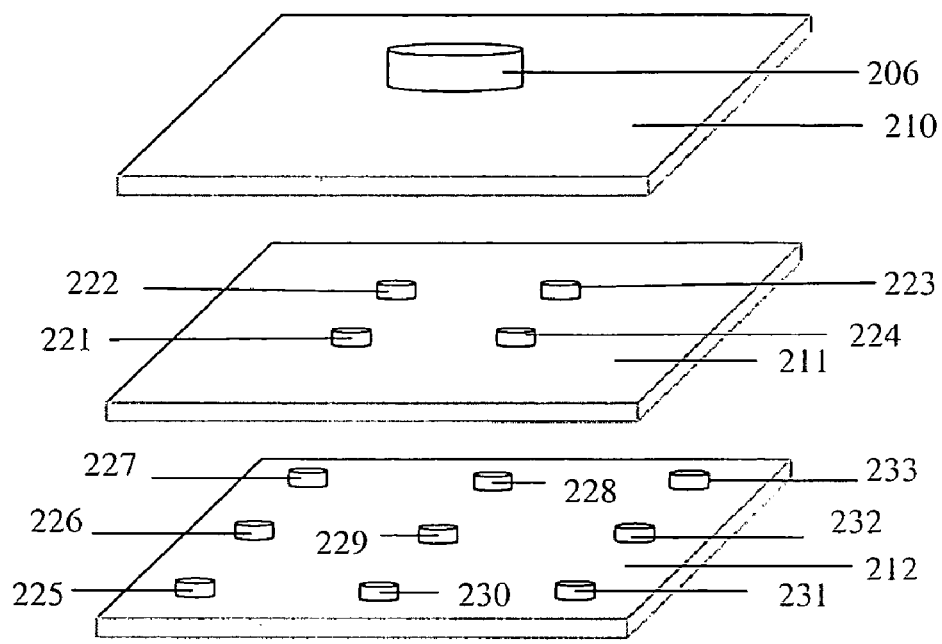
FIG. 4 schematically illustrates a first embodiment of a current spreading layer for an LED according to the invention, FIG. 5 schematically illustrates a second embodiment of a current spreading layer for an LED according to the invention, FIG. 6 schematically illustrates a third embodiment of a current spreading layer for an LED according to the invention, FIG. 7 schematically illustrates a forth embodiment of a current spreading layer for an LED according to the invention, and FIG. 8 schematically illustrates an electron beam (e-beam) evaporation method for fabricating a current spreading layer.

Referring to FIGS. 3 and 4, in the preferred embodiment the current spreading layer 201 comprises three sub-layers 210, 211, 212 of light transmissive conducting film such as Indium Tin Oxide (ITO). An array of thin flat metallic pads 221-224 and 225-233 are distributed between the sub-layers 210, 211, 212 for spreading an electrical current passing between the electrode 106 and the p-type semiconductor material 202. The metallic pads 221-224 and 225-233 have an ohmic resistance that is lower than the ohmic resistance of the sub-layers 210, 211, 212. Current is therefore caused to spread Out to take the path of least resistance presented by the metallic pads 221-224 and 225-233.

The first sub-layer 210 of light transmissive conducting film adjoins electrode terminal 106. The thirds sub-layer 212 adjoining the semiconductor material. The third sub-layer 211 is located between the first sub-layer 210 and third sub-layer 212. Between the first and second sub-layers 210, 211 the first group of metallic pads 221-224 are distributed in an area slightly larger that the area of the electrode terminal 106. Between the second and third sub-layers 211, 212 the second group of metallic pads 225-233 are distributed in an area slightly larger that the first group of metallic pads 221-224, but slightly smaller than the area of the active region 104. This spreading pattern of the metallic pads 225-233 between the sub-layers 210, 211, 212 spreads the current as it passes through each sub-layer from the electrode 106 and the p-type semiconductor material 202.

Figure 5:
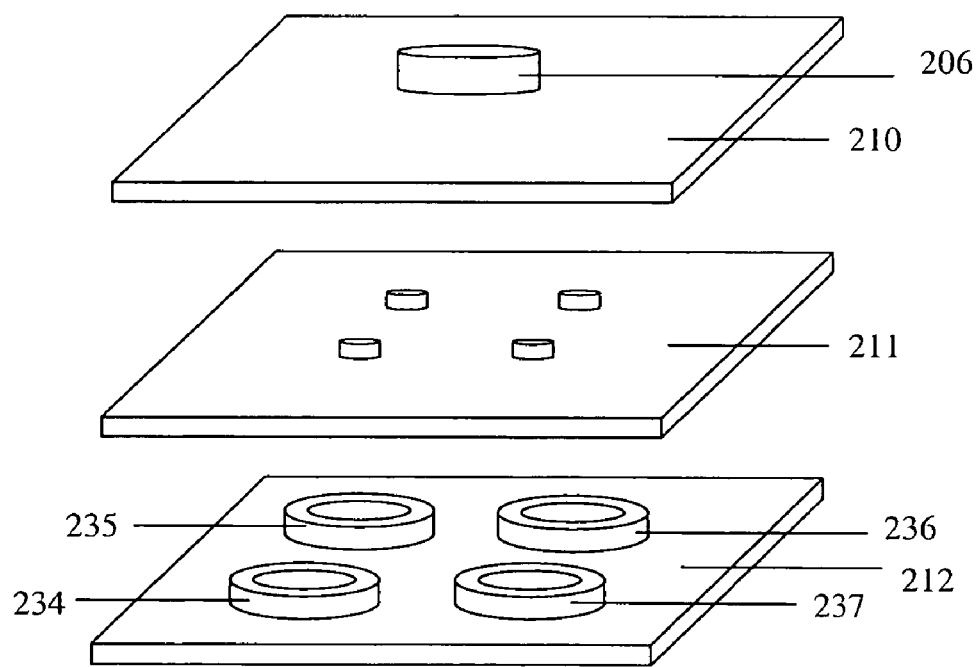

Referring to FIG. 5, in an alternative embodiment of the current spreading layer the second group of metallic pads 225-233 is in the form of a four annual metallic pads 234-237. The four annual metallic pads 234-237 are concentric with respective ones of the four metallic pads of the first group 221-224, and have a larger distribution area to spread the current as it passes down through the sub-layers 210, 211, 212.

Figure 6:
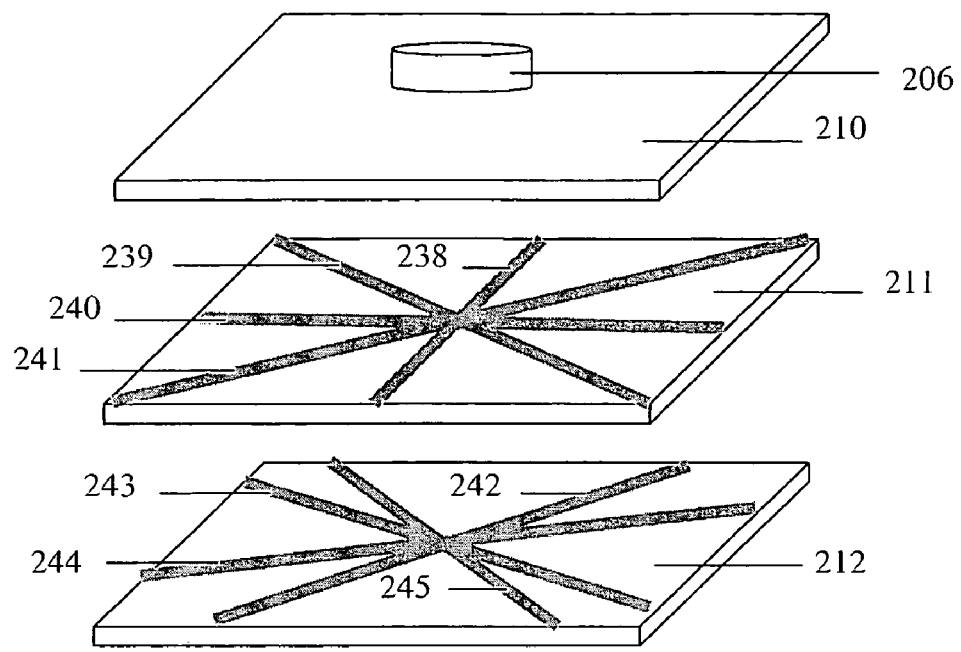

Referring to FIG. 6, in another alternative embodiment of the current spreading layer the metallic pads are intersecting tracks. The first group comprises four radially extending tracks 238-241 angularly displaced from each other by 45 degrees. The second group comprises four radially extending tracks 242-245 angularly displaced from each other by 45 degrees The first and second groups of tracks are concentric and angularly displaced from each other by 22.5 degrees between consecutive sub-layers. The tracks create a pattern of metallic pads distribute through the current spreading layer to evenly spread a current as it passes from the electrode 106 and the p-type semiconductor material 202.

Figure 7:
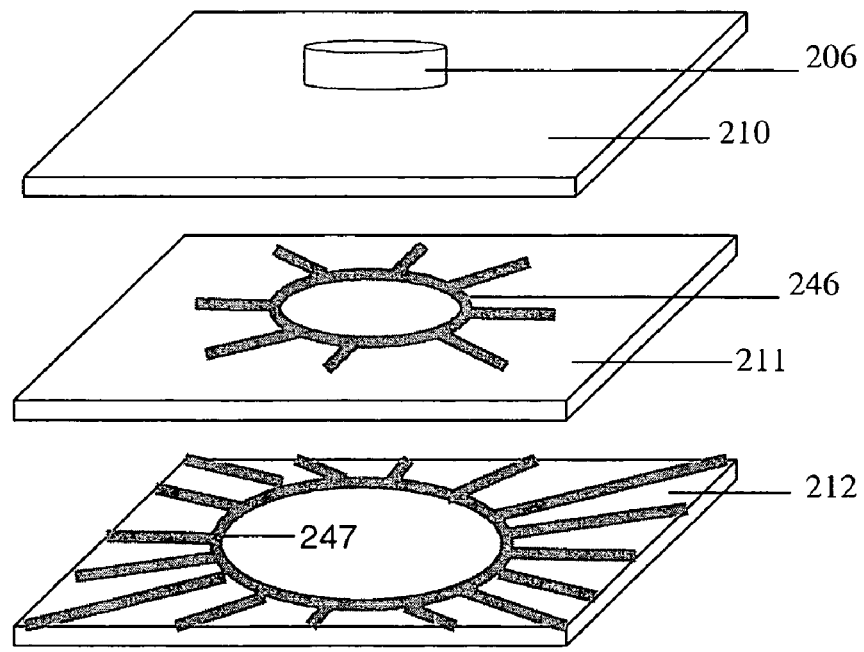

Referring to FIG. 7, in yet another alternative embodiment of the current spreading layer the metallic pads are annular tracks with radially extending limbs. The first such pad 246 between the first and second sub-layers 210, 211 is distributed in an area slightly larger that the area of the electrode terminal 106. The second pad 247 between the second and third sub-layers 211, 212 is distributed in an area slightly larger that the first pad 246. Both pads 246, 247 are concentric with the electrode and create a pattern of metallic pads distribute through the current spreading layer to evenly spread a current as it passes from the electrode 106 and the p-type semiconductor material 202.

The metal pads are deposited onto the sub-layers of the current spreading layer using an electron beam evaporation process; also know as e-beam evaporation. E-beam evaporation is well known in that art and uses physical vapor deposition (PVD) to transfer a material, such as metal, to a substrate forming a thin film or coating on the substrate. In the process a source, or block, of the material to be deposited and substrate are placed inside a vacuum chamber. The block of material is heated using an electron beam causing it to evaporate. The molecules of the material evaporate freely in the vacuum chamber and then condense on all surfaces including the substrate.

Figure 8:
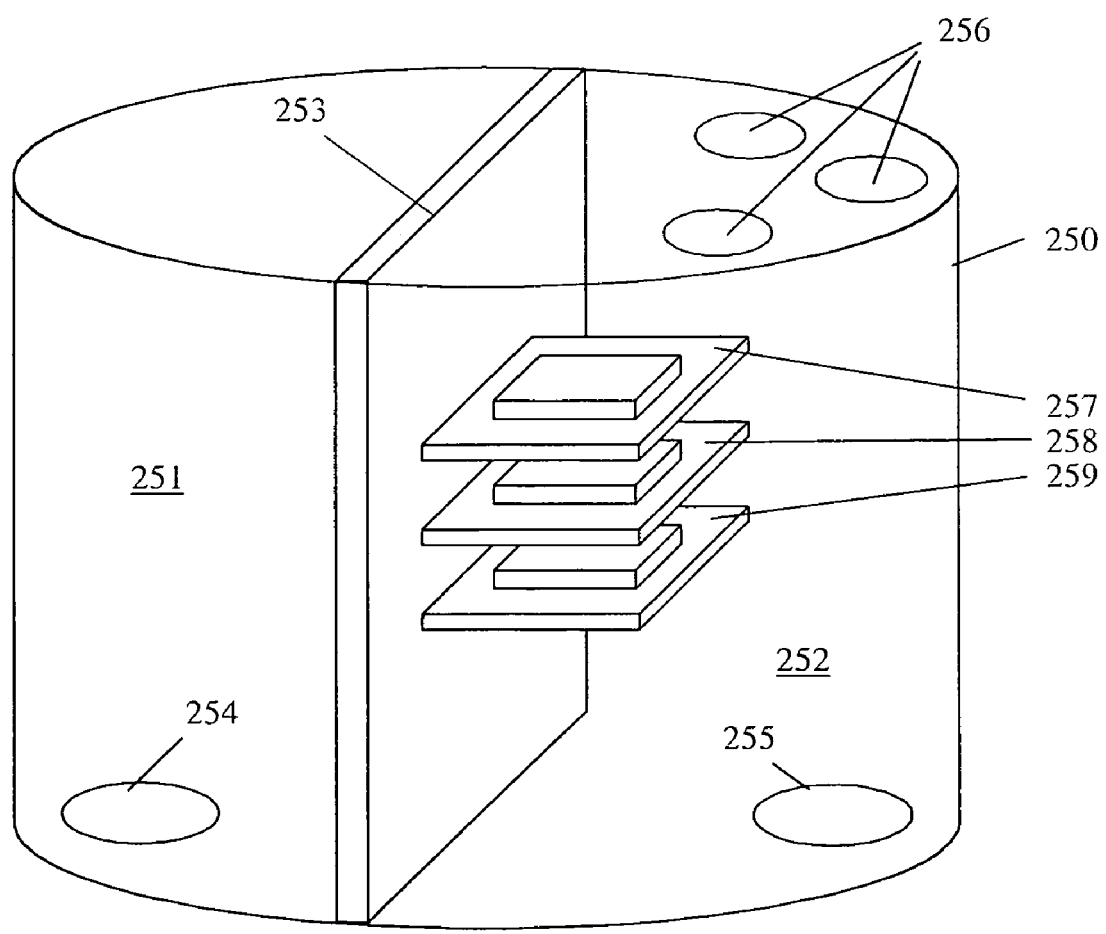

FIG. 8 illustrates a typical setup for coating a plurality of interspersed layers of ITO film and metal pads onto a semiconductor wafer. A cylindrical vacuum enclosure 250 has two deposition chambers 251, 252 separated by a dividing partition 253. The first chamber 251 is used to deposit the ITO film and the second chamber 252 is used to deposit the metal pads. Crucibles 254, 255 for the ITO and metal evaporation materials are located at the bottom of the respective deposition chambers. Semiconductor wafers 256 to receive the deposited materials are located at the top of the cylindrical vacuum enclosure. A plurality of suitable masks 257, 258, 259 are located in the metal deposition chamber 252 for creating the desired pattern of metallic pads on each sub-layer of transparent film. A controller and electron beam gun (not shown) are provided for independent control of deposition of each material.

To form a current spreading of the invention layer a first ITO sub-layer is deposited onto the LED wafers 256 in the transparent film deposition chamber 251 of the e-beam machine. The wafers 256 are then rotated to the metal deposition chamber 252 above the first mask 257 (with desired pattern) and metal pads are deposited onto the first ITO sub-layer. Since there is a shadow mask, the metal is appropriately deposited and patterned on top of ITO sub-layer. The wafers 256 are rotated again to the transparent film deposition chamber 251 for deposition of the second ITO sub-layer. The wafers 256 are rotated back to the metal deposition chamber 252 above the second mask 258 (with desired pattern) and metal pads are deposited onto the second ITO sub-layer. The process is repeated over time until all desired layers are well deposited and patterned. Each time a different shadow mask is used to achieve the desired spreading pattern of the metallic pads 225-233 between the sub-layers 210, 211, 212.

It should be appreciated that modifications and/or alterations obvious to those skilled in the art are not considered as beyond the scope of the present invention. For example, the light transmissive conducting film of the sub-layers may be any suitable material such as ITO, AZO, CZO, NiO and others known in the art. Further the pads need not be metallic, but may be any suitable material having an ohmic resistance that is lower than the ohmic resistance of the sub-layers so that current is caused to spread out to take the path of least resistance presented by the pads distributed between the sub-layers. The four embodiments of the current spreading layer shown in FIG. 4 through 7 are not intended to limit the scope or functionality of the invention. The skilled addressee will appreciate that alternative patterns for the metallic pads are possible which will achieve the desired result of evenly spreading a current as it passes from the electrode 106 and the p-type semiconductor material 202.

What is claimed is:

1. A semiconductor device having a layer of semiconductor material, an electrode for connecting the semiconductor material to an electrical power supply and a current spreading layer located between the electrode and the semiconductor material, wherein the current spreading layer comprises at least a first sub-layer of a first material adjoining the electrode, a second sub-layer of the first material adjoining the semiconductor material and a third sub-layer of the first material located between the first and second sub-layers and regions of a second material distributed between the sub-layers for spreading an electrical current passing between the electrode and the semiconductor material, and wherein the regions of second material have a first distribution density between the first sub-layer and the third sub-layer and have a second distribution density between the third sub-layer and second sub-layer, and wherein the second distribution density is greater than the first distribution density.

2. The device of claim 1 wherein the first material has a first ohmic resistance and the second material has a second ohmic resistance that is lower than the first ohmic resistance.

3. The device of claim 1 wherein the regions of the second material comprise an array of thin flat metallic pads.

4. The device of claim 1 wherein the second material is of the same type as the electrode.

5. The device of claim 1 wherein the semiconductor material contains a p-type dopant.

6. A semiconductor device having two or more regions of doped semiconductor material, a pair of electrodes for connecting the semiconductor device to a power supply and a current spreading layer located between one of the electrodes and the semiconductor device, wherein the current spreading layer comprises a first sub-layer of thin transparent film having a first ohmic resistance, a second sub-layer of the thin transparent film and a third sub-layer of the thin transparent film located between the first and second sub-layers, and flat thin metallic pads having a second ohmic resistance distributed between the sub-layers, and wherein the flat thin metallic pads have a first distribution density between the first and third sub-layers and have a second distribution density between the third and second sub-layers, and wherein the second distribution density is greater than the first distribution density, and wherein the second ohmic resistance is lower than the first ohmic resistance.

7. The device of claim 6 wherein the flat thin metallic pads are distributed in a grid array pattern.

8. The device of claim 6 wherein the flat thin metallic pads are distributed in a pattern adapted to spreading an electrical current passing between the electrode and the semiconductor device.

* * * * *